United States Patent
Lin et al.

(10) Patent No.: US 8,946,860 B2
(45) Date of Patent: Feb. 3, 2015

(54) SEMICONDUCTOR DEVICE AND RELATED FABRICATION METHODS

(71) Applicants: Xin Lin, Phoenix, AZ (US); Daniel J. Blomberg, Chandler, AZ (US); Jiang-Kai Zuo, Chandler, AZ (US)

(72) Inventors: Xin Lin, Phoenix, AZ (US); Daniel J. Blomberg, Chandler, AZ (US); Jiang-Kai Zuo, Chandler, AZ (US)

(73) Assignee: Freescale Semiconductor Inc., Austin, TX (US)

( * ) Notice: Subject to any disclaimer, the term of this patent is extended or adjusted under 35 U.S.C. 154(b) by 0 days.

(21) Appl. No.: 13/773,432

(22) Filed: Feb. 21, 2013

(65) Prior Publication Data

US 2014/0231961 A1    Aug. 21, 2014

(51) Int. Cl.
*H01L 29/73* (2006.01)
*H01L 29/66* (2006.01)
*H01L 29/732* (2006.01)
*H01L 29/36* (2006.01)
*H01L 29/06* (2006.01)

(52) U.S. Cl.
CPC .......... *H01L 29/73* (2013.01); *H01L 29/66234* (2013.01); *H01L 29/36* (2013.01); *H01L 29/66272* (2013.01); *H01L 29/732* (2013.01); *H01L 29/0649* (2013.01)
USPC ............................. 257/565; 257/589; 438/335

(58) Field of Classification Search
CPC ..................... H01L 29/66234; H01L 29/6625; H01L 29/735
USPC .................................... 257/565, 589; 438/335
See application file for complete search history.

(56) References Cited

U.S. PATENT DOCUMENTS

| | | | |
|---|---|---|---|
| 4,700,211 A * | 10/1987 | Popovic et al. | 257/423 |
| 4,855,244 A | 8/1989 | Hutter et al. | |
| 5,248,624 A | 9/1993 | Icel et al. | |
| 6,396,126 B1 | 5/2002 | Tsai et al. | |
| 6,399,998 B1 * | 6/2002 | Chang | 257/565 |
| 6,423,590 B2 | 7/2002 | Tsai et al. | |
| 6,445,057 B1 * | 9/2002 | Fujisawa et al. | 257/547 |
| 6,569,730 B2 | 5/2003 | Tsai et al. | |
| 6,768,176 B1 * | 7/2004 | Litfin | 257/355 |
| 6,960,816 B2 * | 11/2005 | Boor | 257/423 |
| 6,977,425 B2 * | 12/2005 | Yoshida et al. | 257/517 |
| 7,110,232 B2 * | 9/2006 | Ausserlechner | 361/90 |
| 2001/0015470 A1 | 8/2001 | Gregory | |
| 2004/0026728 A1 * | 2/2004 | Yoshida et al. | 257/303 |
| 2011/0012232 A1 | 1/2011 | Lin et al. | |

* cited by examiner

*Primary Examiner* — Allan R Wilson
(74) *Attorney, Agent, or Firm* — Ingrassia Fisher & Lorenz, P.C.

(57) ABSTRACT

Semiconductor device structures and related fabrication methods are provided. An exemplary semiconductor device structure includes a collector region of semiconductor material having a first conductivity type, a base region of semiconductor material within the collector region, the base region having a second conductivity type opposite the first conductivity type, and a doped region of semiconductor material having the second conductivity type, wherein the doped region is electrically connected to the base region and the collector region resides between the base region and the doped region. In exemplary embodiments, the dopant concentration of the doped region is greater than a dopant concentration of the collector region to deplete the collector region as the electrical potential of the base region exceeds that of the collector region.

17 Claims, 9 Drawing Sheets

SEMICONDUCTOR DEVICE AND RELATED FABRICATION METHODS

TECHNICAL FIELD

Embodiments of the subject matter described herein relate generally to semiconductor devices and methods for fabricating semiconductor devices, and more particularly, embodiments of the subject matter relate to methods for fabricating semiconductor devices having increased breakdown voltage and Early voltage.

BACKGROUND

During normal operation, the voltage applied to a semiconductor device is constrained by the breakdown voltage of the device, which is the minimum applied voltage that causes avalanche breakdown in the device. For example, the rated voltage across terminals of transistor devices is typically set to a value that is well below the voltage that causes avalanche breakdown in the device to provide sufficient margin that accommodates manufacturing variations and/or transient voltage fluctuations. However, when numerous different types of semiconductor devices (e.g., diodes, field-effect transistors, bipolar junction transistors, and the like) are fabricated on a die or wafer as part of an integrated fabrication process, a breakdown voltage of a particular device may be compromised to achieve the desired performance for the other types of semiconductor devices. For example, a breakdown voltage of a bipolar transistor may be compromised as a result of the fabrication process being tailored to achieve desired on-resistances or breakdown voltages for field-effect transistors fabricated on the wafer. While additional or specialized fabrication process steps may be performed to improve the breakdown voltages or other device parameters, such additional fabrication process steps undesirably increase the cost and/or complexity of fabrication.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures, which are not necessarily drawn to scale.

DETAILED DESCRIPTION

Figure 1:
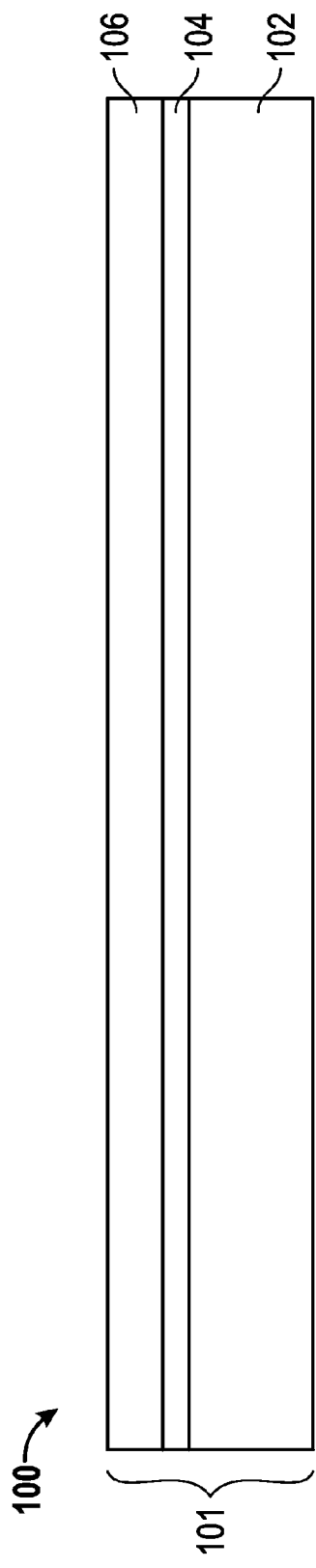
FIGS. 1-10 illustrate, in cross section, a semiconductor device structure and exemplary methods for fabricating the semiconductor device in accordance with one embodiment of the invention.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments of the subject matter described herein generally related to improved bipolar junction transistor structures that are capable of achieving relatively higher collector-to-emitter breakdown voltage and relatively higher Early voltage while being fabricated using process steps that may be optimized for fabricating other device structures (e.g., laterally diffused metal oxide semiconductor (LDMOS) field-effect transistors or other MOS transistors) concurrently fabricated on the same semiconductor substrate. As described in greater detail below, in exemplary embodiments, the collector region of the bipolar transistor structure is surrounded laterally by a doped sinker region of the opposite conductivity, and the doped sinker region is electrically connected to the base region, and therefore, has the same electrical potential of the base region. Additionally, the collector region overlies a buried region having the same conductivity as the base region and the doped sinker region, and the doped sinker region abuts or otherwise contacts the buried region. In this manner, the collector region is effectively surrounded by doped regions of the opposite conductivity, which are biased to the electrical potential (or voltage) of the base. Thus, as the electrical potential of the base is increased relative to the collector, the sinker region and the buried region cooperatively deplete or otherwise distribute a portion of the electrical potential of the collector laterally and vertically away from the base and/or emitter, so that portions of the collector region enclosed by the sinker regions and the buried region are more fully depleted.

In exemplary embodiments, the bipolar transistor is fabricated on a silicon-on-insulator (SOI) substrate, with the collector region being realized as a relatively lightly doped epitaxial layer that is formed on the relatively higher doped buried region. By virtue of the collector being more lightly doped than the surrounding regions (e.g., the base region, the buried region and the sinker regions), portions of the collector may be more fully depleted when the base is biased with at a higher potential. As a result, the potential of the portions of the collector region beneath the emitter regions stops following the collector bias voltage, thus the base width modulation is reduced, which, in turn, results in a relatively higher Early voltage. In addition, the portions of the collector region closest to the emitter regions may be fully depleted before the punch-through between the emitter and the collector, resulting in a relatively higher collector-to-emitter breakdown voltage.

FIGS. 1-10 illustrate, in cross-section, methods for fabricating a semiconductor device structure 100 suitable for use as a bipolar transistor in accordance with exemplary embodiments. It should be appreciated that although the subject matter may be described herein in the context of a PNP bipolar transistor device, the subject matter is not intended to be limited to PNP bipolar transistor devices and may be implemented in an equivalent manner for an NPN bipolar transistor device (e.g., by interchanging the conductivities of the doped regions). Various steps in the manufacture of semiconductor devices are well known and so, in the interest of brevity, many conventional steps will only be mentioned briefly herein or will be omitted entirely without providing the well known process details. It should be noted that in some embodiments, the semiconductor device structure 100 may be rectangular, square, or circular in shape or otherwise formed so that the regions depicted as being separate in the cross-sections of FIGS. 1-10 may be integral or otherwise continuous, as will be appreciated in the art. Thus, the plural form "regions" may be used herein to describe regions that appear to be separate in the cross-section, but in practice, may be a single integral region.

Referring now to FIG. 1, in exemplary embodiments, fabrication of the semiconductor device structure 100 begins by providing or otherwise obtaining a substrate 101 of semiconductor material. In the illustrated embodiment, the fabrication process begins by obtaining a silicon-on-insulator (SOI) substrate 101 having a support (or handle) layer 102 of semiconductor material, an insulating layer 104 of dielectric material on the support layer 102, and a layer 106 of semiconductor material on the insulating layer 104. As described in greater detail below, in exemplary embodiments, the layer 106 of semiconductor material is utilized to epitaxially grow additional semiconductor material for subsequently fabricating one or more transistor devices thereon, and accordingly, for convenience, but without limitation, the layer 106 of semiconductor material may alternatively be referred to herein as the seed layer. In an exemplary embodiment, the semiconductor material of each of the layers 102, 106 is realized as a silicon material, wherein the term "silicon material" is used herein to encompass the relatively pure silicon materials typically used in the semiconductor industry as well as silicon admixed with other elements such as germanium, carbon, and the like. Alternatively, one or more of the layers 102, 106 may be realized as germanium, gallium arsenide, and the like, and/or one or more of the layers 102, 106 may include layers of different semiconductor materials. In accordance with one embodiment, the insulating layer 104 is realized as an oxide layer formed in a subsurface region of the semiconductor substrate 101, also known as a buried oxide (BOX) layer. For example, a buried oxide layer may be formed by oxidizing a wafer of semiconductor material (e.g., seed layer 106) which is then bonded to the support layer 102 to provide the insulating layer 104 of oxide material between the support layer 102 and the seed layer 106.

In exemplary embodiments, the support layer 102 and the seed layer 106 are each lightly doped. For example, the seed layer 106 may be realized as a P-type silicon material having a P-type dopant concentration (e.g., boron ions or a boron ionized species) in the range of about $1\times10^{13}/cm^3$ to about $1\times10^{17}/cm^3$, and more particularly, about $1\times10^{15}/cm^3$. Similarly, the support layer 102 may also be doped with the same (or different) conductivity-determining impurity type as the seed layer 106. In exemplary embodiments, the support layer 102 is realized as an N-type silicon material having a N-type dopant concentration in the range of about $1\times10^{13}/cm^3$ to about $1\times10^{17}/cm^3$, and more particularly, about $1\times10^{15}/cm^3$. It should be understood that the fabrication process described herein is not constrained by the substrate of semiconductor material utilized, and the fabrication process described herein may also be used to create devices from a bulk semiconductor substrate.

Figure 2:
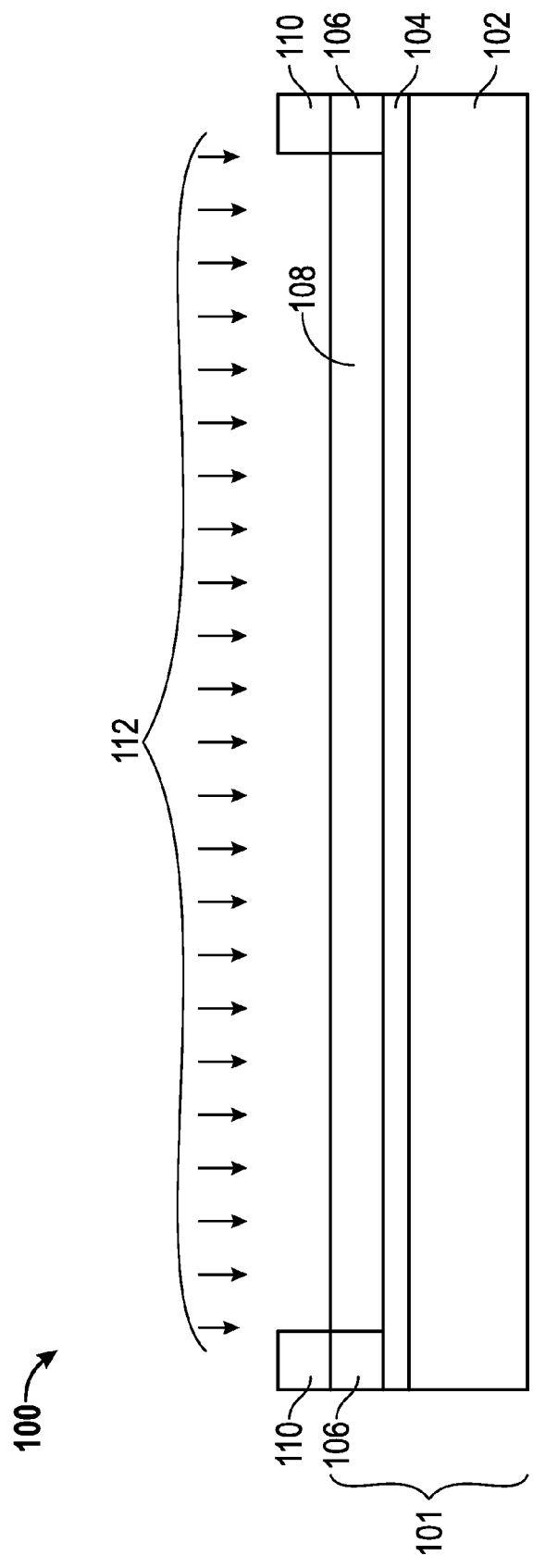

Referring to FIG. 2, in exemplary embodiments, fabrication of the semiconductor device structure 100 continues by masking peripheral portions of the semiconductor device structure 100 and forming a doped region 108 of semiconductor material within the seed layer 106 having a conductivity type that is opposite the conductivity of the seed layer 106. The doped region 108 is formed by masking the semiconductor device structure 100 with a masking material 110, such as a photoresist material, that is patterned to provide an implantation mask that exposes the interior portion of the seed layer 106 to be used for the doped region 108. The doped region 108 is then formed by implanting N-type ions, such as antimony ions and/or phosphorous ions, illustrated by arrows 112, in the seed layer 106 with a dopant concentration in the range of about $1\times10^{16}/cm^3$ to about $1\times10^{20}/cm^3$, and more particularly about $1\times10^{19}/cm^3$, and at an energy level in the range of about 50 kiloelectron volts (keV) to about 2000 keV. In the illustrated embodiment, the depth of the doped region 108 (after subsequent thermal annealing or any other diffusion) corresponds to the thickness of the seed layer 106 so that the doped region 108 extends to and abuts or otherwise contacts the insulating layer 104. For example, in accordance with one or more embodiments, the thickness of the seed layer 106 may be within the range of about 0.5 micrometer (or micron) to about 4 microns (depending on the needs of a particular application), such that the doped region 108 has a depth in the range of 0.5 micron to about 4 microns that corresponds to the thickness of the seed layer 106. It should be noted that the thickness of the doped region 108 is not constrained to the thickness of the seed layer 106 and may increase in thickness as a result of subsequent processing (e.g., up-diffusion during subsequent epitaxial growth).

Figure 3:
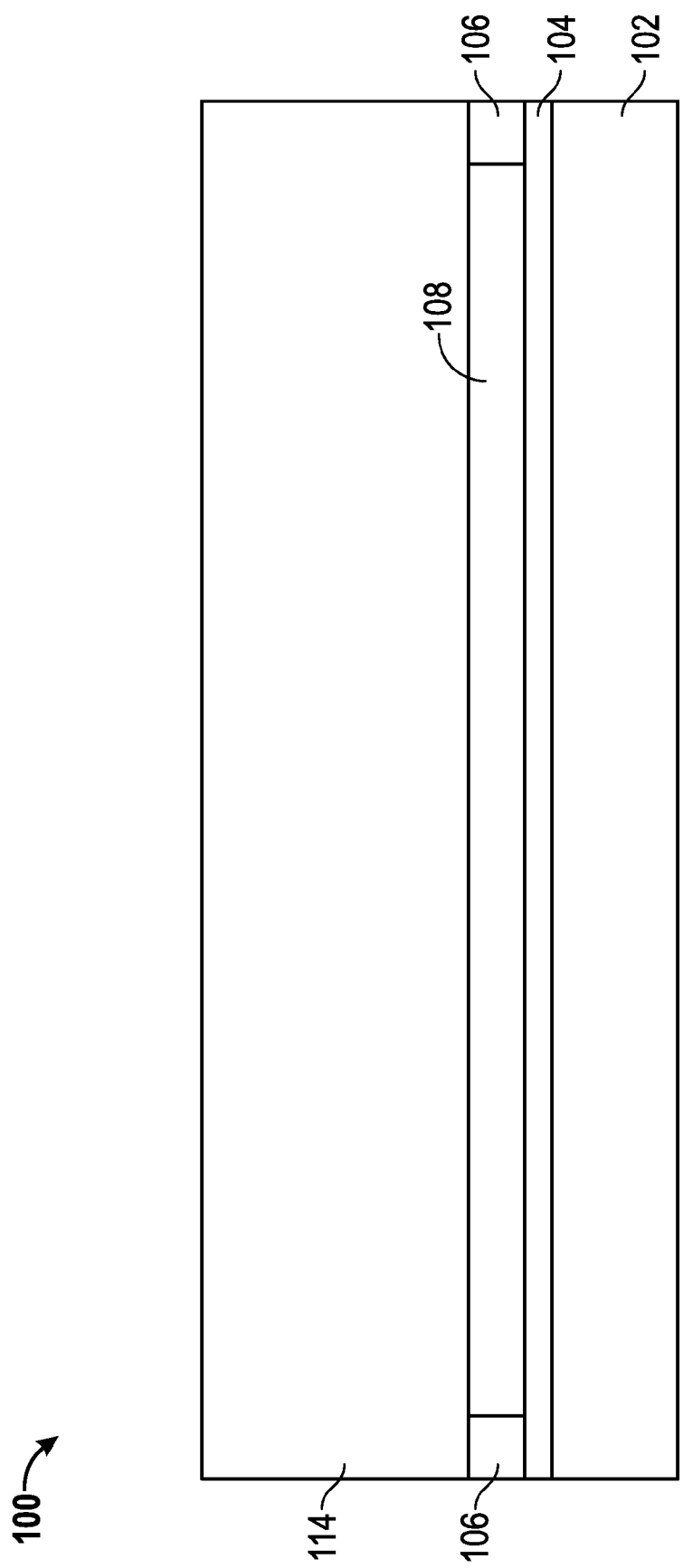

Referring now to FIG. 3, after forming the doped region 108, fabrication of the semiconductor device structure 100 continues by removing the masking material 110 and forming or otherwise providing a doped region 114 of semiconductor material overlying the doped region 108 that has a conductivity type that is opposite that of the doped region 108. For example, a P-type epitaxial layer 114 may be formed by epitaxially growing silicon material on the seed layer 106 and in-situ doping the silicon material by adding boron ions (or other P-type ions) to the reactants used to epitaxially grow the layer 114. In one or more embodiments, the epitaxial layer 114 has a P-type dopant concentration in the range of about $1\times10^{13}/cm^3$ to about $1\times10^{16}/cm^3$, and more particularly about $1\times10^{15}/cm^3$. In this regard, the dopant concentration of the epitaxial layer 114 is less than the dopant concentration of the doped region 108 by one or more orders of magnitude (e.g., by factor of ten or more). In an exemplary embodiment, the epitaxial layer 114 is grown to a thickness in the range of about 2 microns to about 9 microns, which may vary depending on the needs of a particular application. For example, in one embodiment, the seed layer 106 has a thickness of about 1.5 microns and the epitaxial layer 114 has a thickness of about 3 microns so that the resulting thickness of semiconductor material overlying the insulating layer 104 is about 4.5 microns. After formation of the epitaxial layer 114, the doped region 108 occupies a subsurface region of the semiconductor device structure 100, and accordingly, may alternatively be referred to herein as a buried region.

Figure 4:
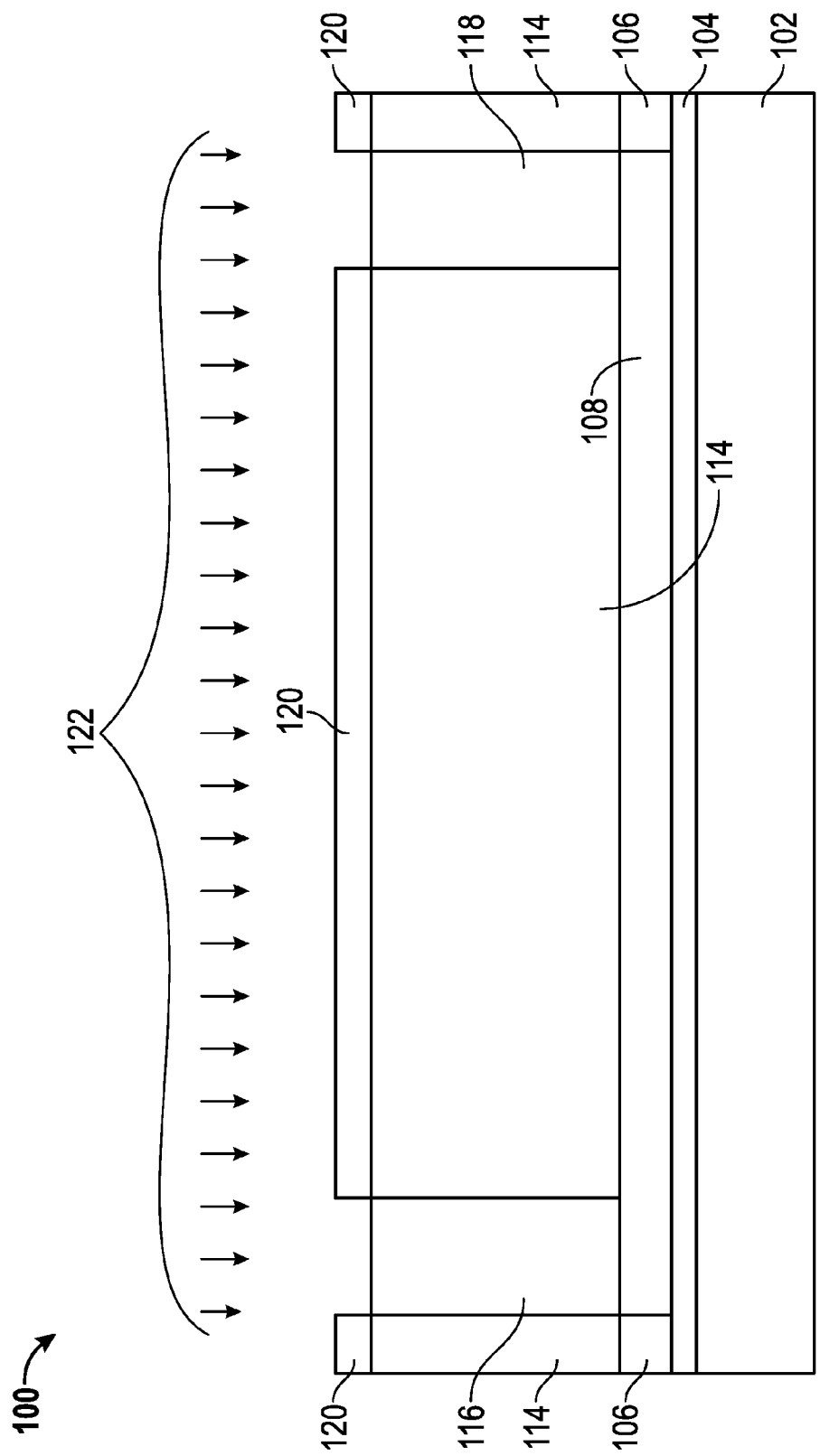

Turning now to FIG. 4, after forming the epitaxial layer 114, the fabrication process continues by masking the interior portion of the epitaxial layer 114 and forming doped sinker regions 116, 118 of semiconductor material having the opposite conductivity type within the epitaxial layer 114. It should be noted that although the cross-sectional view illustrates two doped sinker regions 116, 118, in practice, the sinker regions 116, 118 are integral and provide a contiguous or continuous doped sinker region about the periphery of the epitaxial layer 114 that circumscribes or otherwise laterally encloses the epitaxial layer 114. The sinker regions 116, 118 are formed by masking the semiconductor device structure 100 with a masking material 120 that is patterned to provide an implantation mask that exposes the peripheral portions of the epitaxial layer 114 to be used for the sinker regions 116, 118. For example, N-type sinker regions 116, 118 are formed by implanting N-type ions, such as phosphorous ions or arsenic ions, illustrated by arrows 122, in the epitaxial layer 114 with a dopant concentration in the range of about $1\times10^{16}/cm^3$ to about $1\times10^{19}/cm^3$, and more particularly within the range of about $1\times10^{17}/cm^3$ to about $1\times10^{18}/cm^3$. In this regard, the dopant concentration of the N-type sinker regions 116, 118 is also greater than the dopant concentration of the P-type epitaxial layer 114, and preferably, by one or more orders of magnitude. The ions are implanted at an energy level in the range of about 2000 keV to about 3000 keV to provide the N-type sinker regions 116, 118 with a depth (after subsequent thermal annealing or any other diffusion) corresponding to the thickness of the epitaxial layer 114 so that the N-type sinker regions 116, 118 extend to and abut or otherwise contact the N-type buried region 108, thereby electrically connecting the N-type sinker regions 116, 118 to the N-type buried region 108.

Figure 5:
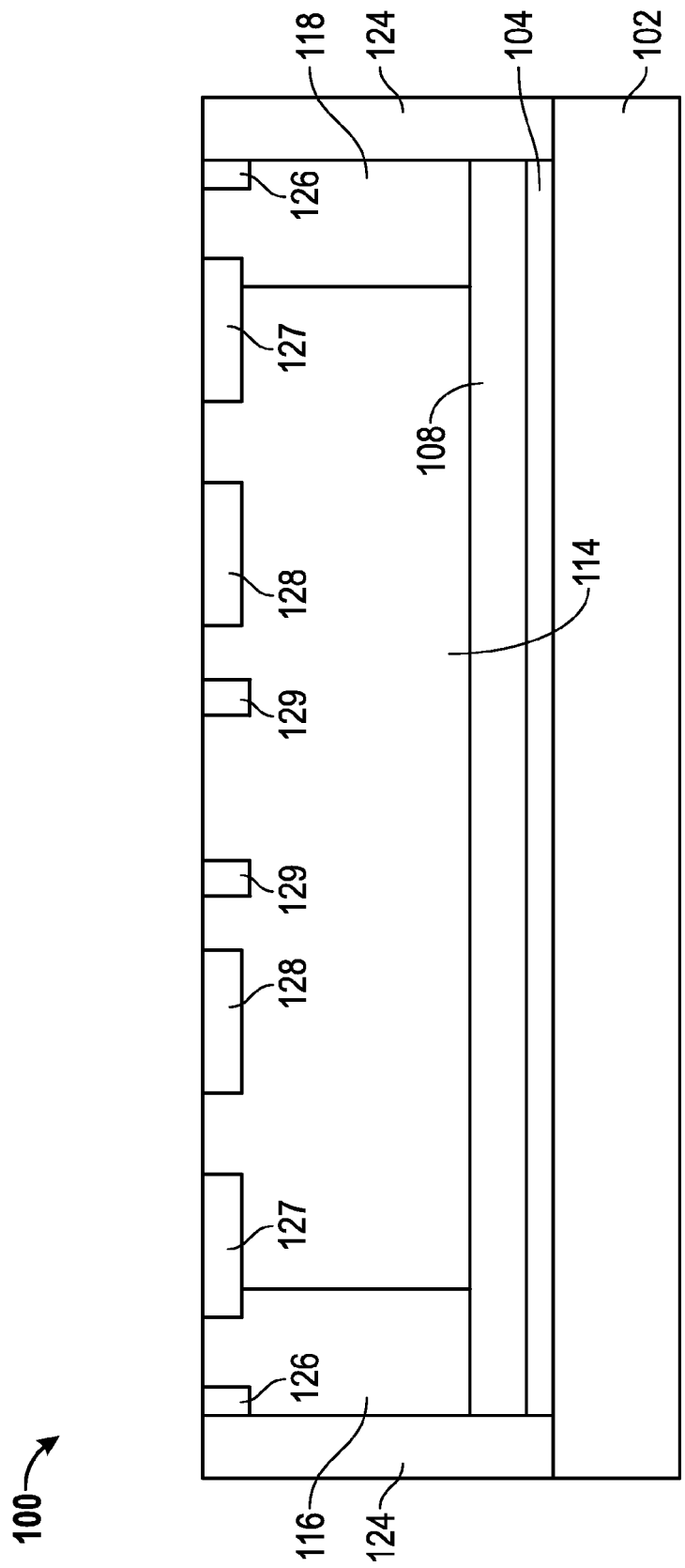

Referring now to FIG. 5, the illustrated fabrication process by isolating the bipolar transistor structure from adjacent semiconductor devices by performing shallow trench isolation (STI) to form shallow isolation regions 126, 127, 128, 129 of a dielectric material in the upper portions of the epitaxial layer 114 and performing deep trench isolation (DTI) to provide deep isolation regions 124 of a dielectric material in the lower portions of the epitaxial layer 114 that extend to the support layer 102. As illustrated, the shallow isolation regions 126, 127 may extend laterally into the upper portions of the N-type sinker regions 116, 118 adjacent to subsequently formed deep isolation regions 124. To form the shallow isolation regions 126, 127, 128, 129, the interior portion of the device structure 100 is masked with a masking material that is patterned to expose portions of the epitaxial layer 114, which are then etched to a desired depth (which is less than the thickness of the epitaxial layer 114), and a dielectric material, such as an oxide material, may be deposited to fill the trenches, resulting in shallow isolation regions 126, 127, 128, 129. In accordance with one or more exemplary embodiments, the depth of the shallow isolation regions 126, 127, 128, 129 is in the range of about 0.05 microns to about 1 micron, and more preferably, within the range of 0.2 microns to 0.5 microns. The shallow isolation regions 126, 127, 128, 129 help define the lateral boundaries of subsequently formed shallow contact regions and/or the electrode contacts formed thereon, as described in greater detail below in the context of FIGS. 8-10. After forming shallow isolation regions 126, 127, 128, 129, the fabrication process continues by performing DTI to provide deep isolation regions 124. For example, to form deep isolation regions 124, the interior of the semiconductor device structure 100 is masked with a masking material that is subsequently patterned to expose the peripheral portions of the epitaxial layer 114 and seed layer 106, which are then etched until the insulating layer 104 is etched through, and thereafter, a dielectric material, such as an oxide material, may be deposited in the trenches or grown on exposed surfaces of the trenches to fill the trenches. Although not illustrated in FIG. 5, in some embodiments, an inner conductive material, such as a doped polysilicon material, may be formed in the interior or central portion of the deep isolation regions 124 to facilitate an electrical connection to the support layer 102. The deep isolation regions 124 are integral and provide a contiguous or continuous isolation region that circumscribes or otherwise laterally encloses the bipolar transistor structure to isolate the bipolar transistor structure from adjacent semiconductor devices fabricated on the same semiconductor substrate.

Figure 6:
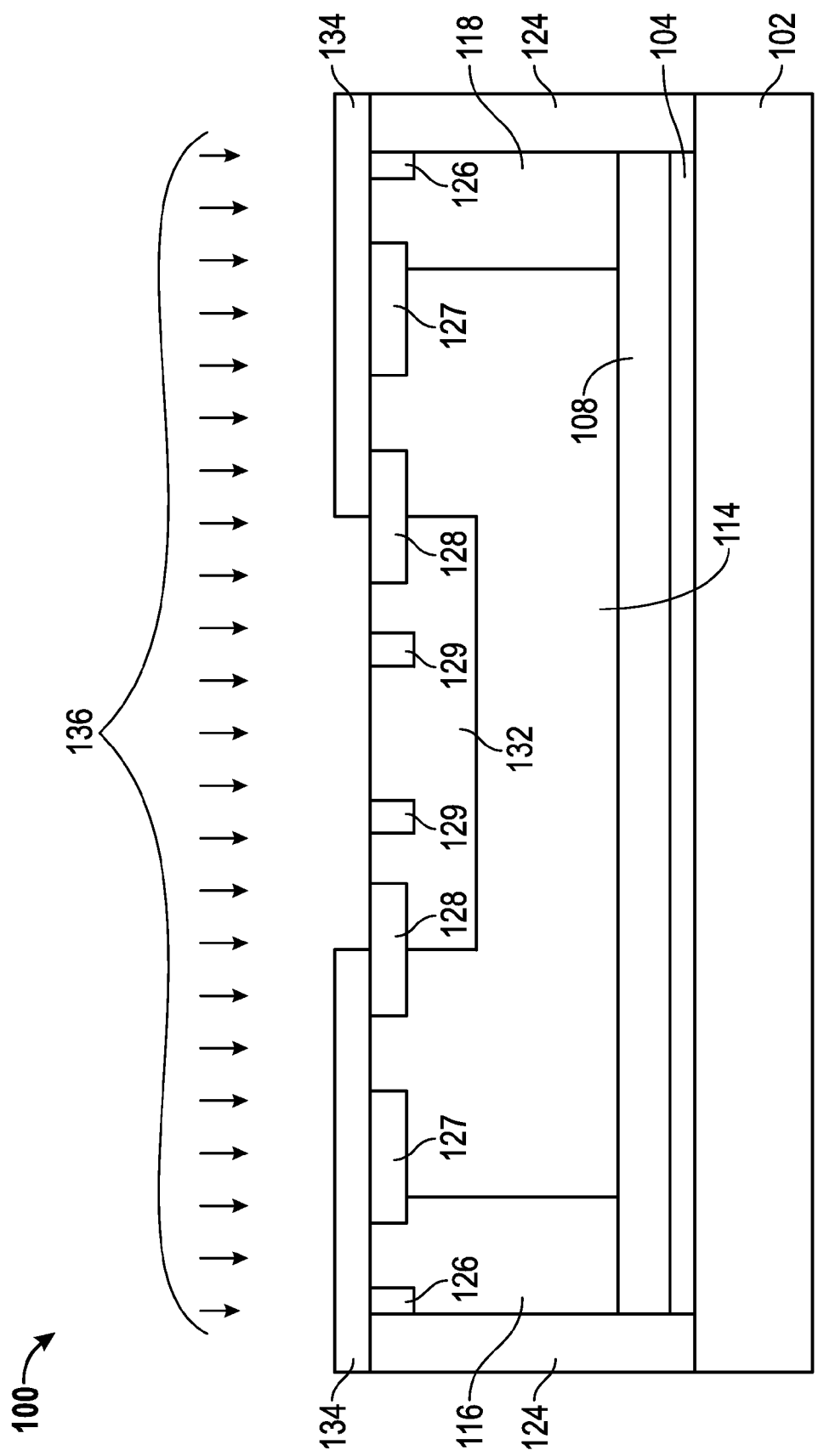

Turning now to FIG. 6, in the illustrated embodiment, the fabrication process continues by forming a well region 132 having a conductivity type that is opposite the conductivity of the epitaxial layer 114 within an interior portion of the epitaxial layer 114. In this regard, the well region 132 functions as the base region of the bipolar transistor structure while the surrounding P-type epitaxial layer 114 functions as the collector region of the bipolar transistor structure. For the illustrated embodiment, fabrication of the N-type base region 132 is achieved by masking the semiconductor device structure 100 with a masking material 134 that is patterned to provide an implantation mask that exposes the central portion of the epitaxial layer 114. As illustrated, the remaining masking material 134 masks the N-type sinker regions 116, 118 and the peripheral portions of the epitaxial layer 114 to physically isolate or otherwise separate the base region 132 from the sinker regions 116, 118. In this regard, the base region 132 does not physically contact the sinker regions 116, 118. The N-type base region 132 is then formed by implanting N-type ions, such as phosphorous ions or arsenic ions, illustrated by arrows 136, into the central portion of the P-type epitaxial layer 114 with a dopant concentration that is greater than the dopant concentration of the P-type epitaxial layer 114, preferably within the range of about $1\times10^{16}/cm^3$ to about $1\times10^{18}/cm^3$. In this regard, the dopant concentration of the base region 132 may be one or more orders of magnitude greater than the dopant concentration of the P-type epitaxial layer 114. In one embodiment, the dopant concentration of the base region 132 is less than the dopant concentration of the sinker regions 116, 118. In exemplary embodiments, the ions 136 are implanted at an energy level in the range of about 250 keV to about 2000 keV to provide the N-type base region 132 with a depth (after subsequent thermal annealing or any other diffusion) that is less than the thickness of the epitaxial layer 114 so that a portion of the P-type epitaxial layer 114 remains underneath the N-type base region 132 between the base region 132 and the buried region 108 to physically isolate or otherwise separate the base region 132 from the buried region 108. In this regard, the base region 132 does not physically contact the buried region 108. In accordance with one or more exemplary embodiments, the depth of the N-type base region 132 is in the range of about 0.5 microns to about 2 microns. In one embodiment, the thickness of the portion of the epitaxial layer 114 beneath the base region 132 is about 1 micron.

After formation of the N-type base region 132, the remaining region of P-type epitaxial layer 114 that functions as the collector is bordered by (and effectively surrounded or otherwise enclosed by) regions having the opposite conductivity type (e.g., N-type regions 108, 116, 118, 132) and a greater dopant concentration than that of the P-type epitaxial layer 114 that makes up the collector region. As described in greater detail below in the context of FIG. 10, by virtue of the higher dopant concentration of the surrounding regions, the portions of the collector region 114 surrounded by the base region 132, the sinker regions 116, 118 and the buried region 108 may be more fully depleted as the electrical potential of the base is increased.

Figure 7:
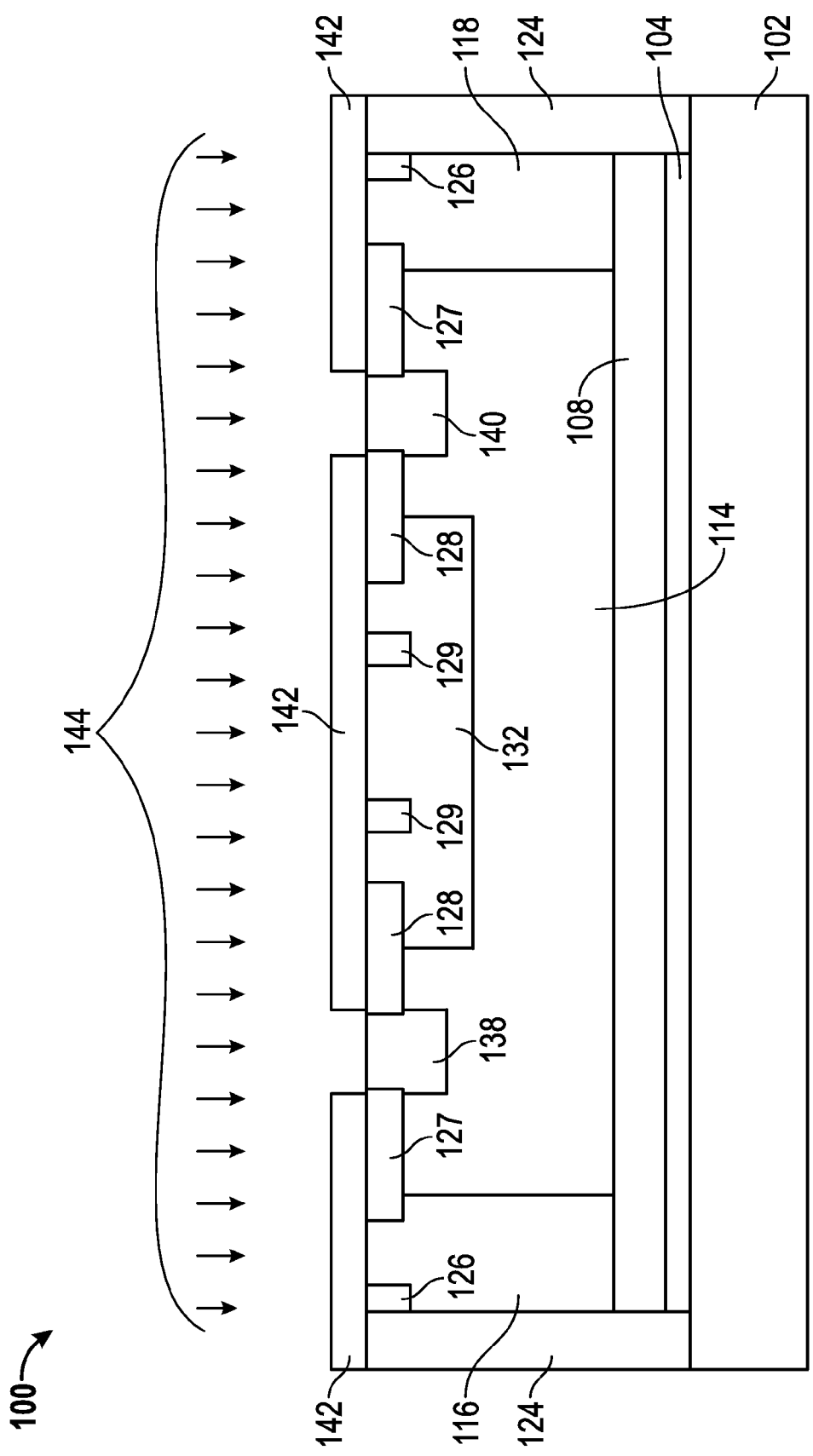

Turning now to FIG. 7, in the illustrated embodiment, fabrication of the device structure 100 continues by masking the N-type regions 116, 118, 132 and forming P-type well regions 138, 140 in portions of the P-type epitaxial layer 114 between the N-type base region 132 and the N-type sinker regions 116, 118. To fabricate P-well regions 138, 140, the semiconductor device structure 100 is masked with a masking material 142 that is patterned to provide an implantation mask that exposes portions of the P-type epitaxial region 114 between the N-type base region 132 and the surrounding N-type sinker regions 116, 118 while masking the N-type regions 116, 118, 132 and the portions of the P-type epitaxial region 114 adjacent to the N-type regions 116, 118, 132. The P-well regions 138, 140 are then formed by implanting P-type ions, such as boron ions, illustrated by arrows 144, in the exposed interior portions of the epitaxial layer 114 with a dopant concentration that is greater than the dopant concentration of the P-type epitaxial layer 114, preferably within the range of $1\times10^{16}/cm^3$ to about $1\times10^{19}/cm^3$, and at an energy level in the range of about 100 keV to about 500 keV to provide the P-well regions 138, 140 with a depth (after subsequent thermal annealing or any other diffusion) that may be less than the thickness of the epitaxial layer 114. In one embodiment, a portion of the lighter doped P-type epitaxial layer 114 remains vertically between the P-well regions 138, 140 and the N-type buried region 108 to sustain a high vertical breakdown voltage between the collector and the buried region 108. The P-well regions 138, 140 function as a relatively higher doped portion of the collector to lower the collector resistance. Again, it is noted that although the cross-sectional view illustrates two P-well regions 138, 140, in practice, the P-well regions 138, 140 may be integral and provide a contiguous or continuous region. Additionally, although FIG. 7 depicts the depth of the P-well regions 138, 140 having a depth that is less than a depth of the base region 132, in practice, the depth of the P-well regions 138, 140 may vary to suit the needs of a particular application.

Figure 8:
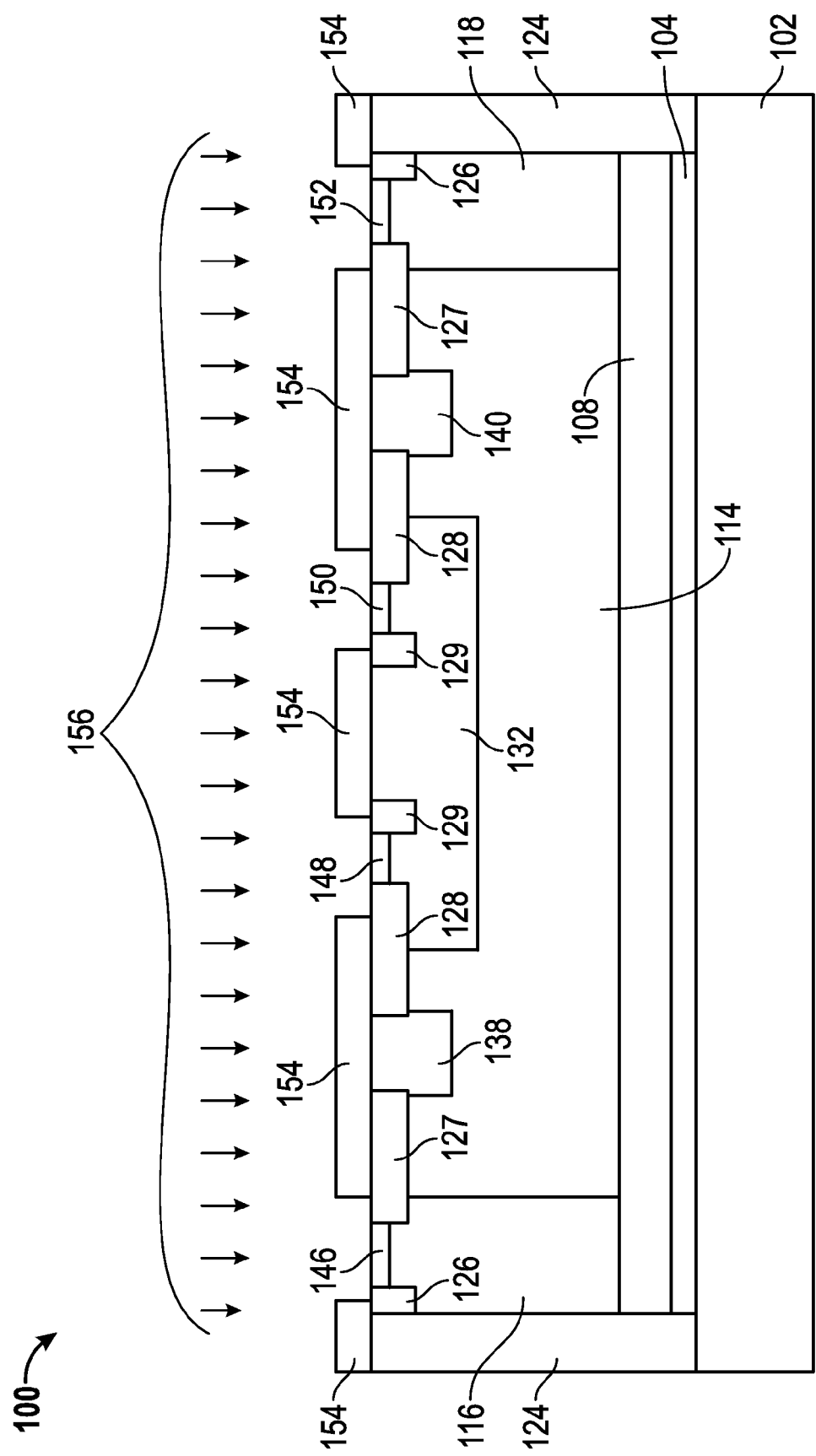
Figure 9:
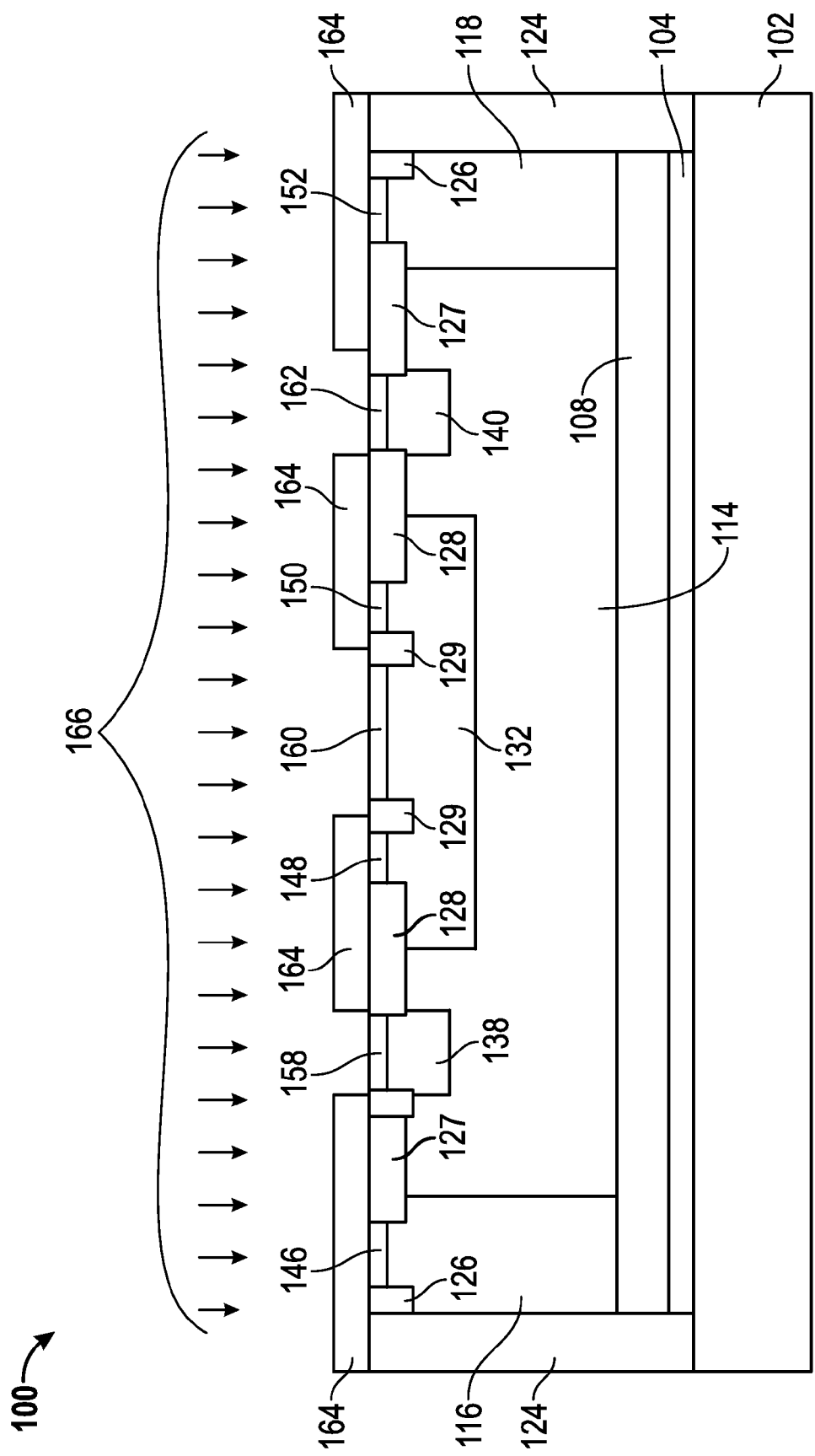

Referring now to FIGS. 8-9, after forming the P-well regions 138, 140, the fabrication process continues by appropriately masking the semiconductor device structure 100, forming shallow N-type regions 146, 148, 150, 152 within the N-type sinker regions 116, 118 and base region 132 and forming shallow P-type regions 158, 160, 162 within the P-well regions 138, 140 and the N-type base region 132. In this regard, the shallow P-type region 160 within the base region 132 functions as the emitter of the bipolar transistor, while P-type regions 158, 162 function as contact regions for the collector. N-type regions 148, 150 function as contact regions for the base, and N-type regions 146, 152 function as contact regions for the sinker regions 116, 118. Again, it is noted that in practice, the N-type sinker contact regions 146, 152, the N-type base contact regions 148, 150, and the P-type collector contact regions 158, 162 may each be realized as an integral or contiguous doped region. Additionally, although not illustrated in FIGS. 8-9, practical embodiments of the fabrication process may also include the formation of relatively lighter doped extension regions for the emitter region 160.

As illustrated in FIG. 8, the shallow N-type contact regions 146, 148, 150, 152 are formed by masking the semiconductor device structure 100 with a masking material 154 that is patterned to expose the N-type sinker regions 116, 118 and portions of the base region 132 that are spaced apart from the lateral boundaries between the base region 132 and the P-type epitaxial region 114. The shallow N-type contact regions 146, 148, 150, 152 are then formed by implanting N-type ions, such as phosphorous ions or arsenic ions, illustrated by arrows 156, in the exposed portions of the N-type regions 116, 118, 132 with a dopant concentration in the range of about $1\times10^{19}/cm^3$ to about $1\times10^{21}/cm^3$ and at an energy level in the range of about 20 keV to about 100 keV to provide the N-type contact regions 146, 148, 150, 152 with a depth (after diffusion) that is less than a depth of the shallow isolation regions 126, 127, 128, 129. For example, in accordance with one or more embodiments, the depth of the shallow N-type contact regions 146, 148, 150, 152 is in the range of about 0.05 microns to about 0.3 microns.

Referring to FIG. 9, in a similar manner, the shallow P-type regions 158, 160, 162, are formed by masking the semiconductor device structure 100 with a masking material 164 that is patterned to expose the P-well regions 138, 140 and the central portion of the N-type base region 132 surrounded by the shallow isolation region 129. After the masking material 164 is patterned, the shallow P-type contact regions 158, 160, 162 are formed by implanting P-type ions, such as boron ions, illustrated by arrows 166, in the exposed portions of the P-well regions 138, 140 and the N-type base region 132 with a dopant concentration in the range of about $1\times10^{19}/cm^3$ to about $1\times10^{21}/cm^3$ and at an energy level in the range of about 2 keV to about 50 keV to provide the P-type contact regions 158, 160, 162 with a depth (after diffusion) that is less than a depth of the shallow isolation regions 126, 127, 128, 129 (e.g., in the range of about 0.05 microns to about 0.3 microns). Thereafter, the masking material 164 is removed.

Figure 10:
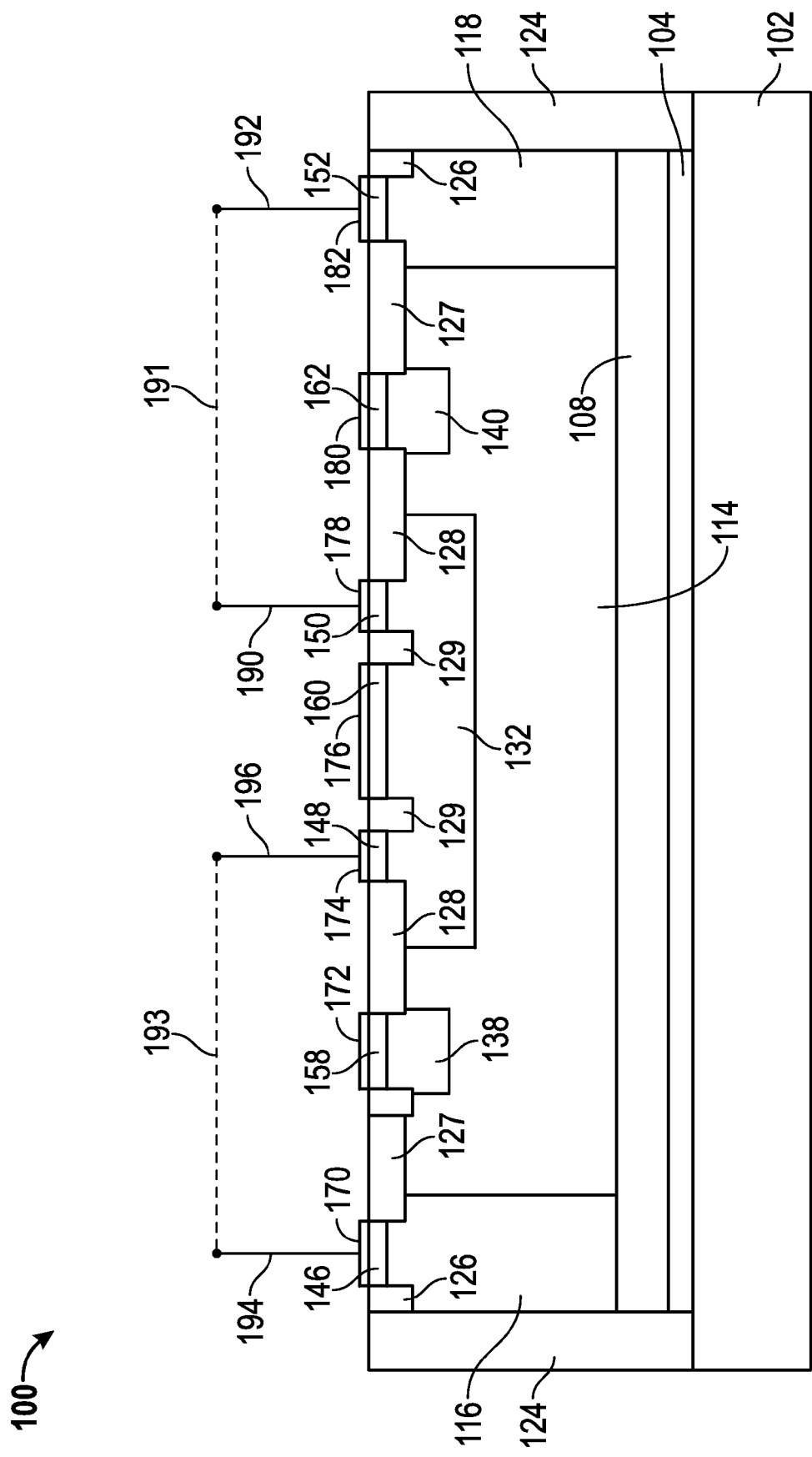

Turning now to FIG. 10, in the illustrated embodiment, after the shallow contact regions are formed, fabrication of the device structure 100 continues by forming contacts 170, 172, 174, 176, 178, 180, 182 overlying the contact regions 146, 158, 148, 160, 150, 162, 152. In an exemplary embodiment, the contacts 170, 172, 174, 176, 178, 180, 182 are realized as a metal silicide layer formed by conformably depositing a layer of silicide-forming metal onto the exposed surfaces of the contact regions 146, 158, 148, 160, 150, 162, 152, and the device structure 100 is then heated, for example by RTA, to react the silicide-forming metal with the exposed silicon and form a metal silicide layer 170, 172, 174, 176, 178, 180, 182 at the top of each contact region 146, 158, 148, 160, 150, 162, 152. Any silicide-forming metal that is not in contact with exposed silicon, such as, for example, the silicide-forming metal that is deposited on the isolation regions 126, 127, 128, 129 does not react during the RTA to form a silicide and may subsequently be removed in a conventional manner.

In accordance with one or more embodiments, after forming silicide contacts, fabrication of the device structure 100 continues by forming appropriate electrical interfaces and/or electrical connections to/from the silicide contacts, for example, using subsequently formed interconnect layers overlying the semiconductor device structure 100. In exemplary embodiments, the N-type sinker regions 116, 118 are electrically connected (or shorted) to the N-type base region 132, for example, by providing a conductive connection 193, 191 between a base contact 174, 178 and a sinker contact 170, 182. For example, terminals 190, 192, 194, 196, such as contact plugs or the like, may be formed overlying the contacts 178, 182, 170, 174, and a connection 191, 193 may be provided between the terminals 190, 192, 194, 196, for example, by forming the connection 191, 193 using a conductive trace in an overlying metal interconnect layer. In this manner, the sinker regions 116, 118 and the buried region 108 are effectively biased to the same electrical potential (or voltage) as the base region 132.

One benefit of the semiconductor device structure 100 depicted in FIG. 10 is that when a voltage applied to the base electrode (e.g., at contact 174 and 178) exceeds the voltage (or electrical potential) of the collector electrode, portions of the collector are depleted laterally away from the base region 132 by the N-type sinker regions 116, 118 and vertically away from the base region 132 by the buried region 108. By virtue of the N-type regions 108, 116, 118 surrounding the collector region 114 and the base region 132 having a higher dopant concentration than the collector region 114, the collector region between the collector contact and the base contact may be fully depleted when the base is biased with a high voltage. Upon the depletion, the potential of the collector region below the emitter is effectively fixed at a certain value. As a result, Early voltage for the bipolar transistor device is significantly improved (e.g., increased). Additionally, by virtue of depletion of lightly doped collector before the punch-through between the emitter and collector, the breakdown between the emitter and the collector takes place outside the active bipolar region, giving nearly identical values for the collector-emitter breakdown voltage and the collector-base breakdown voltage. Accordingly, the high-side capability of the bipolar transistor device is improved.

For the sake of brevity, conventional techniques related to semiconductor and/or integrated circuit fabrication, bipolar transistors, biasing, and other functional aspects of the subject matter may not be described in detail herein. In addition, certain terminology may also be used herein for the purpose of reference only, and thus are not intended to be limiting. For example, the terms "first", "second" and other such numerical terms referring to structures do not imply a sequence or order unless clearly indicated by the context.

In conclusion, systems, devices, and methods configured in accordance with example embodiments of the invention relate to:

An apparatus is provided for a semiconductor device. The semiconductor device comprises a collector region of semiconductor material having a first conductivity type, a base region of semiconductor material within the collector region, the base region having a second conductivity type opposite the first conductivity type, and a first doped region of semiconductor material having the second conductivity type, wherein the first doped region is electrically connected to the base region and the collector region resides between the base region and the first doped region. In one or more embodiments, a dopant concentration of the first doped region is greater than a dopant concentration of the collector region, and the collector region overlies the first doped region. In one embodiment, the dopant concentration of the first doped region is at least ten times greater than the dopant concentration of the collector region. In another embodiment, the collector region comprises an epitaxial layer overlying the first doped region. In accordance with one embodiment, the semiconductor device further comprises a support layer of semiconductor material, a buried layer of dielectric material overlying the support layer, and a second doped region of semiconductor material overlying the buried layer, wherein the collector region overlies the second doped region. In one or more further embodiments, the first doped region abuts the second doped region, wherein a dopant concentration of the first doped region is greater than a dopant concentration of the collector region and a dopant concentration of the second doped region is greater than the dopant concentration of the collector region. In accordance with yet another embodiment, the first doped region and the base region are physically isolated by the collector region.

In another exemplary embodiment, a method of fabricating a bipolar transistor on a semiconductor substrate is provided. The method comprises forming a first region of semiconductor material having a first conductivity type in the semiconductor substrate, forming a collector region of semiconductor material having a second conductivity type opposite the first conductivity type overlying the first region, forming a second region of semiconductor material having the first conductivity type that abuts the first region, forming a base region of semiconductor material having the first conductivity type within the collector region of semiconductor material, and providing an electrical connection between the base region and the second region. In one embodiment, forming the collector region comprises forming an epitaxial layer of semiconductor material having the second conductivity type on the first region and forming the second region comprises implanting ions having the first conductivity type and a dopant concentration greater than a dopant concentration of the epitaxial layer into the epitaxial layer. In another embodiment, the semiconductor substrate comprises a silicon-on-insulator substrate including a layer of semiconductor material overlying an insulating layer, wherein forming the first region comprises implanting ions having the first conductivity type into the layer of semiconductor material, and forming the collector region comprises forming an epitaxial layer of semiconductor material having the second conductivity type on the first region. In one embodiment, forming the epitaxial layer of semiconductor material comprises epitaxially growing in-situ doped semiconductor material having a dopant concentration that is less than a dopant concentration of the first region on the first region. In a further embodiment, forming the second region comprises implanting ions having the first conductivity type and a dopant concentration greater than the dopant concentration of the epitaxial layer into the epitaxial layer.

An apparatus for a bipolar transistor is provided in another exemplary embodiment. The bipolar transistor comprises a buried region having a first conductivity type, a collector region overlying the buried region, the collector region having a second conductivity type opposite the first conductivity type, a base region within the collector region, the base region having the first conductivity type, wherein at least a first portion of the collector region resides between the base region and the buried region, and a sinker region having the first conductivity type, wherein the sinker region abuts the buried region, at least a second portion of the collector region resides between the sinker region and the base region, and the sinker region is electrically connected to the base region. In one or more embodiments, the sinker region laterally surrounds the collector region. In another embodiment, a dopant concentration of the collector region is less than a dopant concentration of the buried region, wherein the dopant concentration of the collector region is less than a dopant concentration of the sinker region. In another embodiment, the dopant concentration of the collector region is less than a dopant concentration of the sinker region. In yet another embodiment, the bipolar transistor includes an emitter region within the base region, wherein the emitter region has the second conductivity.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application. Accordingly, details of the exemplary embodiments or other limitations described above should not be read into the claims absent a clear intention to the contrary.

What is claimed is:
1. A semiconductor device comprising:
a collector region of semiconductor material having a first conductivity type;
a base region of semiconductor material within the collector region, the base region having a second conductivity type opposite the first conductivity type; and
a first doped region of semiconductor material having the second conductivity type, wherein:
the first doped region is electrically connected to the base region;
the collector region resides between the base region and the first doped region;
the collector region overlies the first doped region; and
a dopant concentration of the first doped region is greater than a dopant concentration of the collector region.

2. The semiconductor device of claim 1, wherein the dopant concentration of the first doped region is at least ten times greater than the dopant concentration of the collector region.

3. The semiconductor device of claim 1, wherein the collector region comprises an epitaxial layer overlying the first doped region.

4. A semiconductor device comprising:
a collector region of semiconductor material having a first conductivity type;
a base region of semiconductor material within the collector region, the base region having a second conductivity type opposite the first conductivity type; and
a first doped region of semiconductor material having the second conductivity type;
a support layer of semiconductor material;
a buried layer of dielectric material overlying the support layer; and
a second doped region of semiconductor material overlying the buried layer, wherein:
the first doped region is electrically connected to the base region;
the collector region resides between the base region and the first doped region; and
the collector region overlies the second doped region.

5. The semiconductor device of claim 4, wherein the first doped region abuts the second doped region.

6. The semiconductor device of claim 5, wherein:
a dopant concentration of the first doped region is greater than a dopant concentration of the collector region; and
a dopant concentration of the second doped region is greater than the dopant concentration of the collector region.

7. The semiconductor device of claim 1, wherein the first doped region and the base region are physically isolated by the collector region.

8. A bipolar transistor comprising:
a buried region having a first conductivity type;
a collector region overlying the buried region, the collector region having a second conductivity type opposite the first conductivity type;
a base region within the collector region, the base region having the first conductivity type, wherein at least a first portion of the collector region resides between the base region and the buried region; and
a sinker region having the first conductivity type, wherein:
the sinker region abuts the buried region;
at least a second portion of the collector region resides between the sinker region and the base region; and
the sinker region is electrically connected to the base region.

9. The bipolar transistor of claim 8, wherein the sinker region laterally surrounds the collector region.

10. The bipolar transistor of claim 8, wherein a dopant concentration of the collector region is less than a dopant concentration of the buried region.

11. The bipolar transistor of claim 10, wherein the dopant concentration of the collector region is less than a dopant concentration of the sinker region.

12. The bipolar transistor of claim 8, wherein the dopant concentration of the collector region is less than a dopant concentration of the sinker region.

13. The bipolar transistor of claim 8, further comprising an emitter region within the base region, the emitter region having the second conductivity type.

14. A semiconductor device comprising:
a collector region of semiconductor material having a first conductivity type;
a sinker region of semiconductor material having a second conductivity type opposite the first conductivity type, wherein the sinker region laterally surrounds the collector region;
a base region of semiconductor material having the second conductivity type within the collector region, at least a first portion of the collector region resides between the sinker region and the base region;
an emitter region of semiconductor material within the base region, the emitter region having the first conductivity type; and
a buried region of semiconductor material having the second conductivity type, wherein:
the collector region overlies the buried region;
the sinker region abuts the buried region;
the sinker region and the buried region are electrically connected to the base region; and
at least a second portion of the collector region resides between the base region and the buried region.

15. The semiconductor device of claim 14, wherein:
a dopant concentration of the buried region is greater than a dopant concentration of the collector region; and
a dopant concentration of the sinker region is greater than the dopant concentration of the collector region.

16. The semiconductor device of claim 15, wherein a dopant concentration of the base region is greater than the dopant concentration of the collector region.

17. The semiconductor device of claim 14, wherein the second portion is beneath the emitter region.

* * * * *